United States Patent [19]

Rauch, Sr. et al.

[11] Patent Number: 4,717,788
[45] Date of Patent: Jan. 5, 1988

[54] METHOD FOR PRODUCING THERMOELECTRIC ELEMENTS

[75] Inventors: Harry W. Rauch, Sr., Lionville; Lewis H. Gnau, deceased, late of Collegeville; June E. Gnau, executrix, Eagleville, all of Pa.

[73] Assignee: General Electric Company, Fairfield, Conn.

[21] Appl. No.: 61,621

[22] Filed: Jun. 15, 1987

Related U.S. Application Data

[62] Division of Ser. No. 679,031, Dec. 6, 1984, abandoned.

[51] Int. Cl.$^4$ .............. H01L 35/14; H01L 35/16
[52] U.S. Cl. .............. 136/237; 136/238; 136/239; 136/201
[58] Field of Search .............. 419/23, 33, 39, 69; 136/201–212, 224–227, 236.1, 237, 238, 239; 427/76, 82, 58

[56] References Cited

U.S. PATENT DOCUMENTS

| | | | |
|---|---|---|---|
| 2,811,440 | 10/1957 | Fritts et al. | 75/166 |
| 2,811,441 | 10/1957 | Fritts et al. | 75/166 |
| 2,811,570 | 10/1957 | Karrer | 136/5 |
| 2,811,571 | 10/1957 | Fritts et al. | 136/5 |
| 3,403,133 | 9/1968 | Frederick et al. | 262/62.3 |
| 3,460,996 | 8/1969 | Kudman | 136/238 |
| 3,899,359 | 8/1975 | Stachurski | 136/205 |
| 3,945,855 | 3/1976 | Skrabek et al. | 136/238 |
| 4,032,363 | 6/1977 | Raag | 136/205 |
| 4,149,025 | 4/1979 | Niculescu | 136/238 |
| 4,268,710 | 5/1981 | Hampl | 136/205 |
| 4,459,428 | 7/1984 | Chou | 136/211 |
| 4,489,742 | 12/1984 | Moore et al. | 136/205 |
| 4,654,224 | 3/1987 | Allred et al. | 427/34 |

OTHER PUBLICATIONS

"Improved Compatible Materials for Thermoelectric Power Generation", AEC, Dismukes et al., Final Report #NYD-3886-2, 11-1968.

Primary Examiner—Stephen C. Bentley
Assistant Examiner—T. J. Wallen
Attorney, Agent, or Firm—Clement A. Berard, Jr.; Robert L. Troike

[57] ABSTRACT

Thermoelectric elements of both P-type and N-type lead tellurides having unique characteristics including, particularly in the case of the P-type, a figure-of-merit 90% above that of the best commercial P-type element, are produced by a new process, involving as key steps chill casting, cold pressing and sintering to 85–90% theoretical density under protective atmosphere.

3 Claims, 7 Drawing Figures

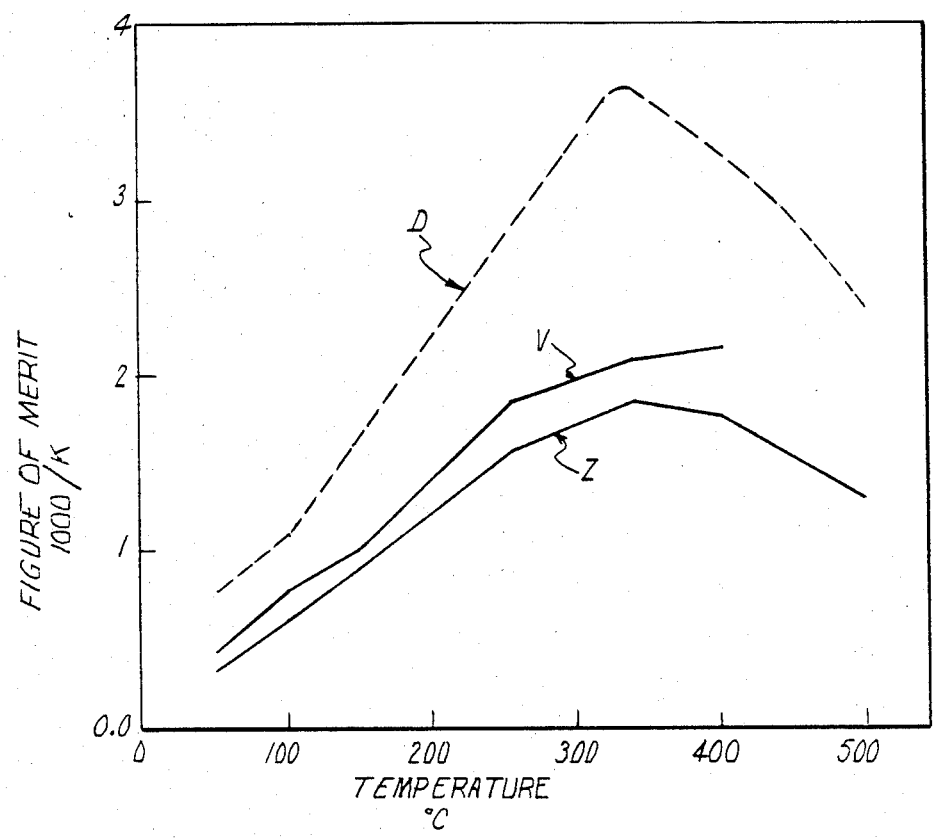
_Fig. 6_
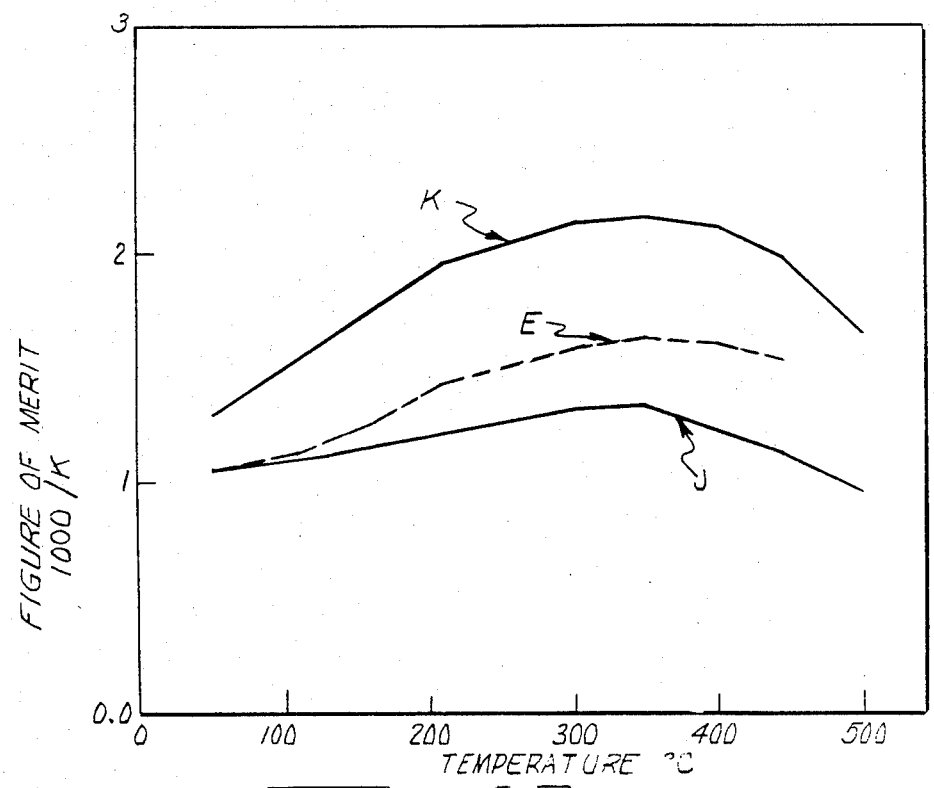
_Fig. 7_

METHOD FOR PRODUCING THERMOELECTRIC ELEMENTS

FIELD OF THE INVENTION

This is a division, of application Ser. No. 679,031, filed Dec. 6, 1984, now abandoned.

The present invention relates generally to the art of thermoelectric power generation and is more particularly concerned with new thermoelectric elements having unique properties, and with a novel method for making those elements

BACKGROUND OF THE INVENTION

Thermoelectric conversion has long been known and generally recognized as affording the prospect of important advantages as a source of electric power, particularly in the form of lightweight, multi-fuel power generators. It has also been known for decades that the semiconducting compound lead telluride (PbTe) is the most efficient thermoelectric material for power generation in the temperature range of major interest from 125°–550° C. The bright promise of this technology in practical application has, however, never been realized. Thus, all the efforts made heretofore to improve the efficiency of thermoelectric conversion elements have resulted in only a marginal gain in that all-important quality as measured by the so-called "figure-of-merit Z", defined as:

$$Z = S^2/pK$$

where S is the Seebeck coefficient, p is the electrical resistivity, and K is the thermal conductivity of the thermoelectric material.

SUMMARY OF THE INVENTION

On the basis of our discoveries set forth in detail below, it is possible now for the first time to produce consistently thermoelectric elements having figures-of-merit up to 90% higher than those previously known. Further, this amazing result is not obtained at the expense of any other desirable property. Thus, mechanical strength, and thermal- and mechanical-shock resistance of the thermoelectric elements of this invention are comparable to the best of the prior art, and they are stable chemically, electrically, and metallurgically under conditions of normal use. They are also readily joined or attached with chemical and metallurgical stability to low-resistance electrical contacts. In other words, unlike thermoelectric elements of the prior art which are crack-prone, particularly in the region of contact, those of this invention retain their integrity throughout over protracted periods of normal use.

An important drscovery of ours upon which this invention is predicated concerns the method by which thermoelectric elements are made. Specifically, we have found that by melting and chill casting a thernoelectric composition, mechanically reducing the resulting ingot to fine powder, cold pressing the powder and sintering the resulting green body under protective atmosphere, an article having novel thermoelectric properties can be produced. Thus, for example, using a P-type composition of the prior art, one practicing the process of this invention can produce a thermoelectric element far superior to that resulting from the prior art practice involving relatively slow cooling the casting and hot pressing the powder.

We have further suprisingly found that although the elements of this invention have about 85% to 87% theoretical density in contrast to the near theoretical density typical of the hot-pressed bodies of the prior art, they have substantially lower electrical resistivity. They also have increased Seebeck coefficients, a correlation contradictory to prior knowledge and experience and without scientifically proven cause. These effects may be connected to the observed weight loss of 3–5% during the sintering process of this invention as this slight change in chemical composition results in a two-phase material. The majority phase appears to be Pb(Te, Se) and the minority phase is elemental Pb. The precipitation of Pb may leach sodium from the Pb(Te, Se) phase, resulting in an increased Seebeck coefficient. While these speculations cannot be confirmed at this time, the two-phase nature of these new products and the fine grain size are readily observed by standard microscopic techniques.

Additional discoveries of ours include the fact that while sintering may be accomplished in 20 to 25 hours at 700° to 800° C., for best results and especially for superior and unique thermoelectric properties, the P-type material should be sintered at 745°–755° C. for 21.5 to 22.5 hours while the N-type material should be sintered at 715°–725° C. for that same length of time. In addition, sintering should always be carried out under a protective atmosphere such as flowing nitrogen and preferably the sintered bodies should be cooled to room temperature under similar protection of nitrogen or the like.

Briefly described, the method of this invention comprises the steps of melting a lead telluride thermoelectric composition, chill casting the resulting melt to produce a fine-grained ingot of substantially uniform composition throughout, mechanically reducing the ingot to provide a powder of particle size less than about 60-mesh, cold pressing the powder to form a green body, and sintering the green body under protective atmosphere.

Likewise broadly and generally stated, a thermoelectric element of this invention comprises an alloy of lead telluride having porosity i.e. density of about 85 to 87% theoretical density and microstructure characterized by about 2% of a filamentary second phase distributed substantially uniformly through the element and segregated in the grain boundaries. Such an element of the P-type comprises an alloy of between 80 and 97 mol percent lead telluride between about 3 and 20 mol percent lead selenide and in addition containing between about 0.5 and 2.0 atomic percent sodium, and said element further has an uniquely high thermoelectric figure-of-merit. The N-type analog is an element of alloy composition between about 80 and 97 mol percent lead telluride and between about 3 and 20 mol percent germanium telluride and in addition contains between about 0.01 and 0.2 mol percent lead iodide.

BRIEF DESCRIPTION OF THE DRAWINGS

In the drawings accompanying and forming a part of this specification,

FIG. 6 is another chart like those of FIGS. 3-5 bearing curves representing plots of figure-of-merit Z values versus temperature of p-type thermoelectric material derived from the data represented by the several curves of each of FIGS. 3-5 and, FIG. 7 is a chart like that of FIG. 6 on which the same data plots have been made, the three curves, however, representing figures-of-merit Z of N-type thermoelectric materials including one of this invention and two of the prior art sources attributed in FIGS. 3-5.

DETAILED DESCRIPTION OF THE INVENTION

Figure 1:
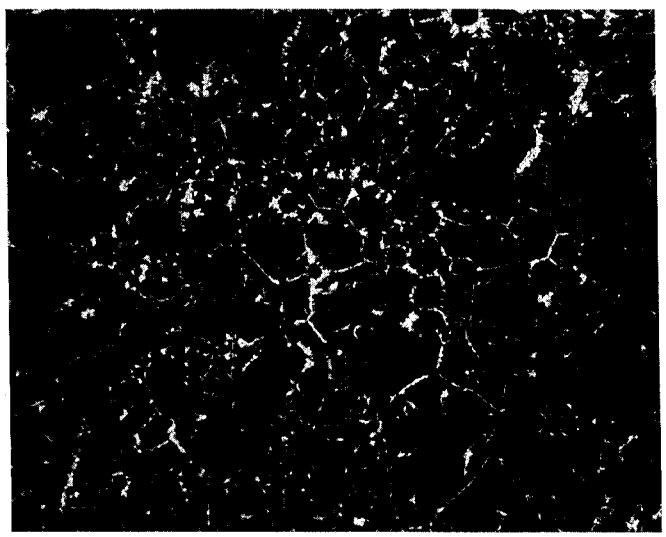
FIG. 1 is a photomicrograph of a P-type thermoelectric element of this invention (magnification 7/16" = 100 microns)

In practice this invention In accordance with a preferred embodiment of it, a p-ype thermoelectric element having the unique properties described above is produced by a process which begins with the step of charging lead, tellurium, selenium and sodium dopant in requisite amounts into a quartz crucible and introducing the crucible into an induction heating coil in a vacuum casting furnace. When the charge has been melted under an inert gas atmosphere, the alloy is cast Into a carbon-coated, water-cooled, copper chill mold. The resulting somewhat friable, fine-grained ingot of homogenous composition thus produced is pulverized and screened to fine powder which in the next step is cold-pressed to desired cylindrical green body size. The green body is sintered by firing it under flowing nitrogen at 750° C. for 22 hours and then furnace cooled under the same protective atmosphere to room temperature.

By carrying out the process in this manner, the detrimental effect of ingot inhomogeniety on the desirable thermoelectric properties of the alloy is avoided. Also, sintering in this manner results in a body which is mechanically strong even though it is unusually porous.

In this case the amounts of alloy constituents PbTe and PbSe in mol percent are 95 and 5, respectively, but slight variations from these amounts are possible and even desirable in certain situations and applications and consequently contemplated in this preferred practice.

Melting in this case involves as a preliminary step the evacuation of the furnace and flushing of it several times with argon or helium to remove oxygen traces, then backfilling with the inert gas and heating to 1,000° C. to melt down the charge and produce the thermoelectric alloy.

Since these melting and casting operations involve vaporization losses of Te to the extent of approximately 0.8 weight percent of the total casting weight in spite of the blanket of one atmosphere of inert gas in the furnace, that extra amount of Te is added to the casting charge in our preferred practice.

Pulverizing of the resulting ingot is easily accomplished because of the friability and porosity of the body. The equipment used and particularly the grinding mill or other means such as mortar and pestle, should be carefully cleaned to avoid contaminating the alloy. Thus, slight impurities can have devastating effects upon the desired thermoelectric properties of the ultimate product of this process.

The cold pressing operation is carried out with a cylindrical-cavity die to provide a thermoelement green body about 2.5 cm long of 0.14 cm diameter. Pressures from 30,000 to 70,000 lbs. per square inch are suitable for this purpose, the latter being our preference.

As cold pressed, the thermoelectric element green bodies have inferior thermoelectric and mechanical strength characteristics. Accordingly, sintering is necessary and is carried out in an inert or reducing atmosphere and results in establishment of equilibrium between the primary PbTe phase and the minor excess phase. In accordance with our preference sintering is carried out under a nitrogen atmosphere in equipment selected and prepared to avoid contamination, the green bodies being placed in quartz boats and carried thereby into the quartz tubes of the sintering furnace. Special care is taken to exclude oxygen from the sintering cycle because of its highly deleterious effects upon both the electrical properties and the thermochemical stability of the ultimate thermoelectric elements.

In another preferred embodiment of this invention, an N-type thermoelectric element of this invention is produced with the unique characteristics described above by following basically the foregoing procedure. In this case, of course, the requisite amounts of the several constituents necessary for the N-type thermoelectric properties are used instead of the constituents employed in P-typ thermoelectric element production. Those skilled in the art will also recognize that depending upon the amounts of lead iodide ($PbI_2$) used, the ultimate thermoelement will have various properties. Thus by using 0.055 mol percent of lead iodide as the dopant, the so-called "3N-type" is produced. When it is desired to gain a different property, particularly figure-of-merit peaking at a lower temperature, the "4N-type" is produced by using only 0.01 mol percent of $PbI_2$. The practical significance of this difference is that elements of the two materials may be segmented to obtain maximum thermoelectric efficiency over the temperature range of practical importance, i.e. 150°-560° C.

The melting and chill casting operations and the pulverizing and cold pressing operations in this instance are carried out in accordance with our preference as described in detail above in reference to the production of the P-type thermoelectric element. The sintering step, however, is carried out under substantially different temperature conditions, that is at temperatures well below those stated in the practice detailed immediately above. Desirably the sintering time is as stated above, that is about 21.5 to 22.5 hours but the temperature to which the green body is subjected during firing is controlled within the 715°-725° C. range. Exposure to temperatures between 700° and 800° for several hours is usually suitable for establishment of equilibrium in the cold press material of either P-type or N-type but again, in accordance with our preference, to obtain the best properties the firing times and temperatures are limited as stated just above and in the detailed description of P-type element production.

Those skilled in the art will gain a further and better understanding of this invention and the new and important advantages which it affords, from the following illustrative, but not limiting, examples of this invention as it has been carried out in actual practice.

EXAMPLE I

In an experimental operation, a P-type thermoelectric element was produced and tested with the results set out below. At the outset, a charge consisting of pieces no larger than ¾ inch in any dimension was prepared as follows:

| Material | Weight (grams) |
|---|---|
| Lead | 623.394 |
| Tellurium | 369.726 |
| Selenium | 11.88 |
| Sodium | 0.484 |
| Total | 1005.484 |

The sodium was placed in the bottom of a clean fused silica crucible and immediately covered with selenium, lead and then tellurium and the crucible is placed in a vacuum furnace chamber which was promptly evacuated and then flushed three times with argon and backfilled with one atmosphere of argon. The crucible and contents were induction heated to about 1,000° in about 15 minutes and the melted charge was then chill cast as it was poured into a graphite-coated, water-cooled, copper mold. By having the mold in the vacuum furnace chamber the melting and casting operations were carried on under the same protective atmosphere and the thermoelectric alloy produced in the melting operation was not exposed to contact with the room atmosphere while the alloy was at elevated temperature.

The resulting friable, somewhat porous, alloy ingot upon removal from the mold was broken into pieces smaller than about ½ in. by ½ in. by 1 in. using a mortar and pestle and those pieces were reduced to powder in a Straub grinding mill and screened, the −60 mesh +200 mesh fraction being selected fo cold pressing as the next step of the process.

Using a steel die of suitable dimensions, a cylindrical green body was produced by charging the selected powder fraction into and filling the die and applying a pressure of 60,000 psi to the charge. In this instance the resulting green body was 1 in. long and of diameter 0.346 in.

Figure 3:
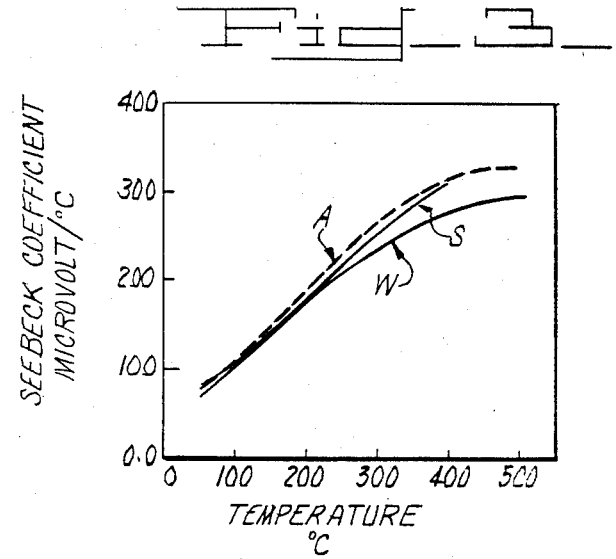
FIG. 3 is a chart bearing three curves representing plots of Seebeck coefficient versus temperature data gathered experimentally in one case and derived from the literature in the others.
Figure 4:
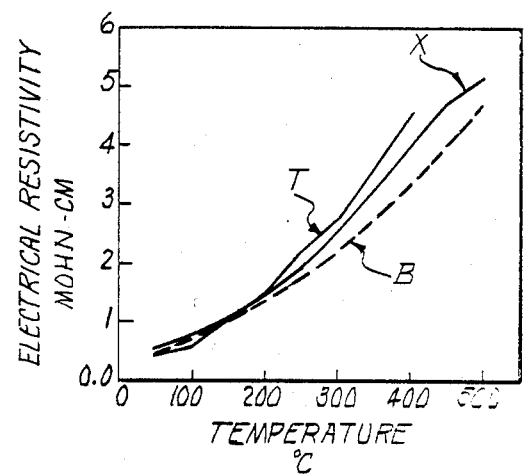
FIG. 4 is another chart like that of FIG. 3 in which the three curves represent plots of electrical resistivity data versus temperature from the same experimental and literature source as those of FIG. 3.
Figure 5:
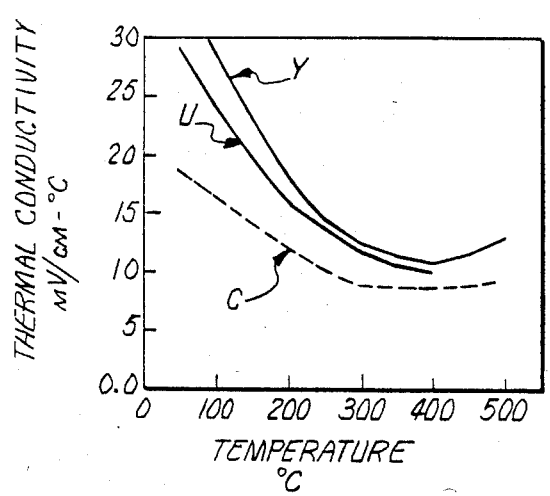
FIG. 5 is still another chart like that of FIGS. 3 and 4 bearing curves representing plots of thermal conductivity versus temperature for the three sources indicated immediately above.

Being mechanically comparatively weak and having inferior properties as a thermoelectric element, the green body was sintered to enhance it greatly in both respects. This was done by first wrapping the body in graphite tape, placing it in a fused silica boat and inserting the boat into the mouth of a furnace tube through which a nitrogen atmosphere was flowed continuously. After about 4 minutes the boat was moved into the furnace hot zone and then after 22 hours at 750° C. the boat with its charge was drawn back out to the furnace tube mouth. Finally, when the boat was cool enough to touch it was taken from the furnace tube and on reaching room temperature the thermoelectric element was removed, unwrapped and subjected to several tests. Data gathered in testing this thermoelectric element are illustrated by Curves A, B and C of FIGS. 3-5, respectively, which compare to Curves S, T and U representing an element of the prior art and Curves W, X and Y representing another element of the prior art. On visual examination no lamination, crack or other physical defect which might adversely affect its electrical or mechanical properties was observed. The density of the element was found to be 85 percent of theoretical density of the material as indicated by the photomicrograph of FIG. 1. The grain size of this element approximating 111 microns was much greater than that of a representative prior art element (i.e. that of Curve S of FIG. 3) which approximated 37 microns. Finally, in plotting the figure-of-merit which takes into account all three of the properties represented by FIGS. 3-5 Curve D of FIG. 6 was developed, illustrating the clear and very surprising superiority of this element over thermoelectric elements of the type previously known in the art represented by Curves V and Z of FIG. 6. Indeed the breakthrough dimensions of this enhancement of desirable properties attests to the unobviousness of the present thermoelectric element as well as of the method by which it is made and those skilled in the art will realize that one following the instructions detailed just above in regard to this particular experiment can expect to reproduce this spectacular result in making such thermoelectric elements.

EXAMPLE II

Following the procedure set forth in detail in Example I, an N-type thermoelectric element was prepared and tested as described below. In this instance the charge was again of 1,000-grams size and consisted of the following:

| Material | Weight (grams) |
|---|---|
| Lead | 610.0 |
| Tellurium | 378.95 |
| Germanium | 11.05 |
| Lead Iodide | 0.7728 |
| Total | 1000.7728 |

Departures from the procedural details set out in Example I mainly concern the necessity for using clean tools and containers throughout. Thus the same mortar and pestle, for example, were not used for both the P-type material of Example I and this N-type material. The melting and chill casting operations were as defined in detail in Example I and the cold pressing operation and sintering operation were also the same except that in firing the thermoelectric element in this instance, the temperature in the furnace hot zone was maintained at 720° C. instead of 750° C.

Figure 2:
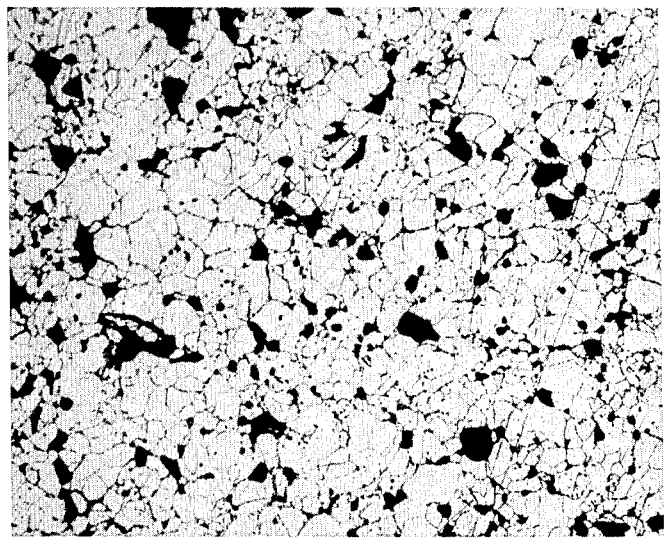
FIG. 2 is a photomicrograph of a N-type thermoelectric element of this invention (magnification 7/16″=100 microns)

Visual examination of the N-type thermoelectric element did not reveal any lamination crack or other physical defect which might adversely affect its electrical or mechanical properties. Density of this body, however, was found to be slightly greater than the P-type body of Example I being measured at 8.00 grams per cubic centimeter, indicating density of about 87% theoretical which is confirmed by the photomicrograph of FIG. 2.

The Seebeck coefficient, electrical resistivity and thermal conductivity measurements were made in this case as they were in the case of the P-type thermoelectric element of Example I. Thus thermal conductivity in both instances was measured by the comparative method and the electrical resistivity and Seebeck coefficient measurements were all likewise measured by the same standard methods and means of the art. The data resulting from these tests of this Example II product are consequently consolidated in the manner described above in the figure-of-merit illustrated by Curve E of FIG. 7. In like manner Curves K and J of FIG. 7 represent the figure-of-merit properties of N-type thermoelectric elements of the prior art.

Where amounts, percentages or proportions are stated in this specification and the appended claims, reference is to the weight basis unless otherwise expressly specified.

All sieve sizes recited herein and in the appended claims are U.S. Standard.

What is claimed is:

1. The method of making a thermoelectric element which comprises the steps of melting a PbTe thermoelectric composition, chill casting the resulting melt to produce a fine-grained ingot of substantially uniform composition throughout, mechanically reducing the ingot to provide powder of particle size less than about 60-mesh, cold pressing the powder at about 30,000 to 70,000 psi to form a generally cylindrical green body, sintering the green body at a temperature between 700°–800° C. for 20–25 hours and finally cooling the resulting sintered body to room temperature under neutral atmosphere.

2. The method of claim 1 in which the thermoelectric composition is 95 mol percent PbTe and 5 mol percent PbSe and contains about 1 atomic percent sodium and in which the green body is sintered at a temperature of about 750° C. for about 22 hours.

3. The method of claim 2 in which the thermoelectric body is of the N-type and the composition consists of about 95 mol percent PbTe, about 5 mol percent GeTe and in addition contains about 0.055 mol percent lead iodide and in which the green body is sintered at a temperature of about 720° C. for about 22 hours.

* * * * *

UNITED STATES PATENT AND TRADEMARK OFFICE
CERTIFICATE OF CORRECTION

PATENT NO. : 4,717,788

DATED : January 5, 1988

INVENTOR(S) : Harry W. Rauch, Sr. et al.

It is certified that error appears in the above-identified patent and that said Letters Patent is hereby corrected as shown below:

Column 1, line 57, "drscovery" should be --discovery--.

Column 1, lines 60, 61, "thernoelectric" should be --thermoelectric--.

Column 3, line 18, "material" should be --materials--.

Column 3, line 29, "practice" should be --practicing--.

Column 3, line 29, "inventIon In" should be --invention in--.

Column 3, line 30, "p-ype" should be --P-type--.

Column 3, line 37, "Into" should be --into--.

Column 4, line 37, "P-typ" should be --P-type--.

Column 5, line 41, "fo" should be --for--.

Signed and Sealed this

Fifth Day of July, 1988

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,717,788

DATED : January 5, 1988

INVENTOR(S) : Harry W. Rauch, Sr. et al.

It is certified that error appears in the above-identified patent and that said Letters Patent is hereby corrected as shown below:

Column 1, line 7, delete ", now abandoned".

Column 3, line 19, "SeveraI" should be --several--.

Column 3, line 29, "1n" should be --In--.

Signed and Sealed this

Twenty-fifth Day of October, 1988

*Attest:*

DONALD J. QUIGG

*Attesting Officer*      *Commissioner of Patents and Trademarks*